(12) United States Patent
Arai et al.

(10) Patent No.: US 6,927,978 B2
(45) Date of Patent: Aug. 9, 2005

(54) ELECTRONIC APPARATUS AND METHOD OF COOLING THE ELECTRONIC APPARATUS

(75) Inventors: Satoru Arai, Kawasaki (JP); Koji Ariga, Ome (JP); Naoki Tashiro, Ome (JP); Tohru Mamata, Akiruno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/753,455

(22) Filed: Jan. 9, 2004

(65) Prior Publication Data

US 2004/0252458 A1 Dec. 16, 2004

(30) Foreign Application Priority Data

Feb. 10, 2003  (JP) ...................................... 2003-032448

(51) Int. Cl.⁷ ................................................ H05K 7/20
(52) U.S. Cl. ...................... 361/695; 361/697; 361/719; 165/80.3; 165/122; 165/185; 257/722; 174/16.3
(58) Field of Search ................................ 361/690, 695, 361/697, 715–721; 165/80.3, 104.33, 122, 185; 174/16.1, 16.3; 257/722

(56) References Cited

U.S. PATENT DOCUMENTS

| | | | | |
|---|---|---|---|---|
| 5,691,883 A | * | 11/1997 | Nelson | 361/697 |
| 5,793,608 A | * | 8/1998 | Winick et al. | 361/695 |
| 6,847,524 B2 | * | 1/2005 | Tomioka et al. | 361/695 |
| 2002/0067595 A1 | * | 6/2002 | Ogawa | 361/687 |

FOREIGN PATENT DOCUMENTS

| | | |
|---|---|---|
| JP | 02-127711 A | 5/1990 |
| JP | 04-284519 A | 10/1992 |
| JP | 06-164177 A | 6/1994 |
| JP | 07-162180 A | 6/1995 |
| JP | 07-244535 A | 9/1995 |
| JP | 10-133782 A | 5/1998 |
| JP | 10-303579 A | 11/1998 |
| JP | 10-307648 | 11/1998 |
| JP | 2000-149542 A | 5/2000 |
| JP | 2000-216575 A | 8/2000 |
| JP | 2001-056724 A | 2/2001 |
| JP | 2001-318738 A | 11/2001 |
| JP | 2002-169626 A | 6/2002 |
| JP | 2002-196842 A | 7/2002 |

OTHER PUBLICATIONS

Japanese Office Action dated May 10, 2005 for Appln. No. 2003–032448.

* cited by examiner

Primary Examiner—Boris Chervinsky
(74) Attorney, Agent, or Firm—Pillsbury Winthrop Shaw Pittman, LLP

(57) ABSTRACT

An electronic apparatus includes a housing, a first heat-generating member provided in the housing, a heat-radiating member thermally connected to the first heat-generating member, a first fan module guiding air to the heat-radiating member, a second heat-generating member provided in the housing, a second fan module discharging air out of the housing, and a wall section provided in the housing, located between the first fan module and the second fan module.

12 Claims, 6 Drawing Sheets

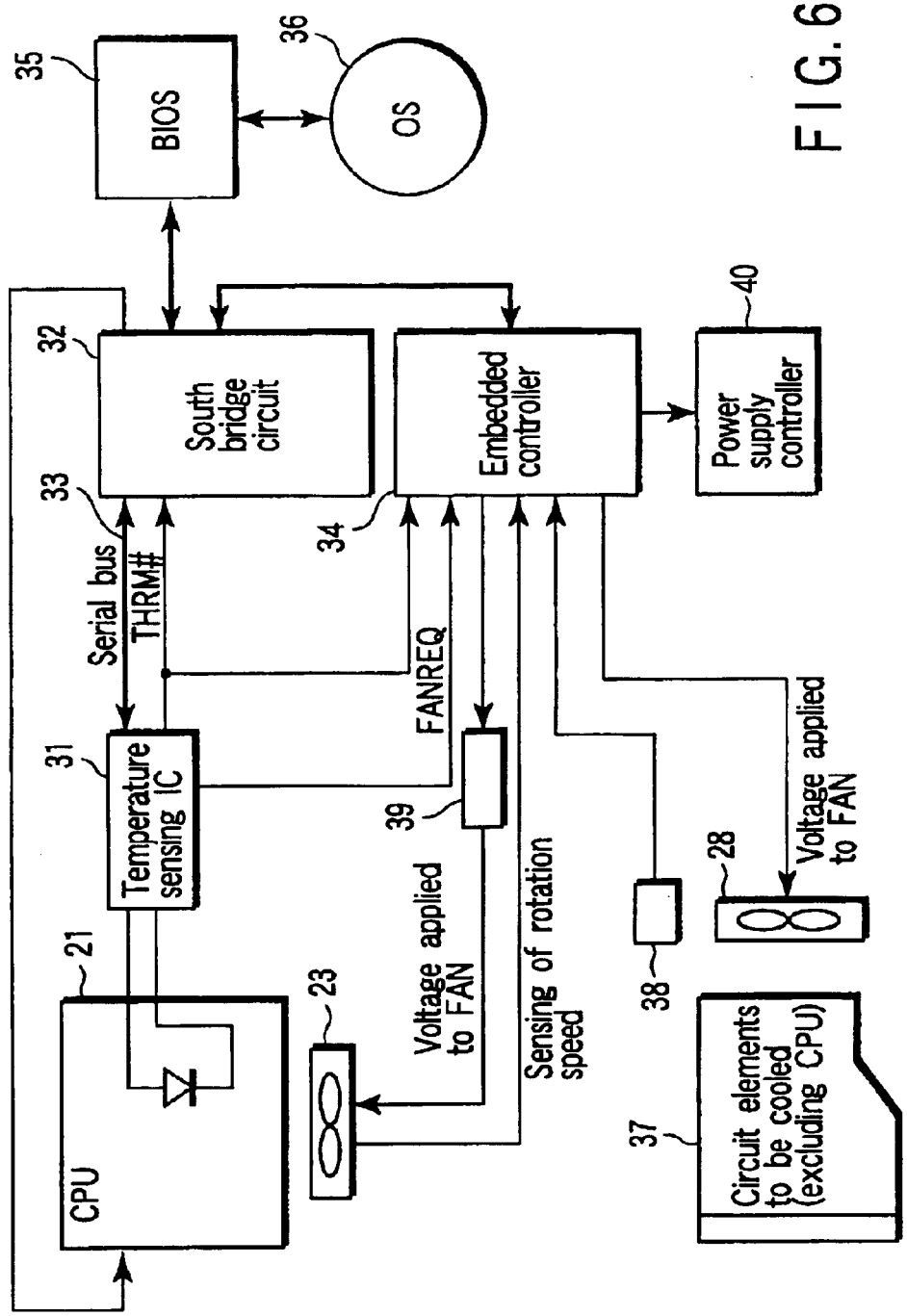
F I G. 6

| CPU fan control register | | System fan control register | |
|---|---|---|---|
| [0] | Rotation speed required by BIOS/OS | [0] | Rotation speed required by BIOS/OS |
| – | – | [1] | On-state temperature of fan sensed by temperature sensing element |
| – | – | [2] | Off-state temperature of fan sensed by temperature sensing element |
| – | – | [3] | Rotation speed of fan required by temperature sensing element |

F I G. 7

| CPU fan control interal table | | System fan control interal table | |
|---|---|---|---|
| [0] | Rotation speed required by BIOS/OS | [0] | Rotation speed required by BIOS/OS |
| [1] | Rotation speed of fan whose on-state is forcibly required | [1] | Rotation speed of fan whose on-state is forcibly required |
| – | – | [2] | Rotation speed of temperature sensing element |

F I G. 8

|  | Temperature range 1 | Temperature range 2 | ... |
|---|---|---|---|
| CPU fan | A1rpm | A2rpm | ... |
| System fan | B1rpm | B2rpm | ... |

F I G. 9

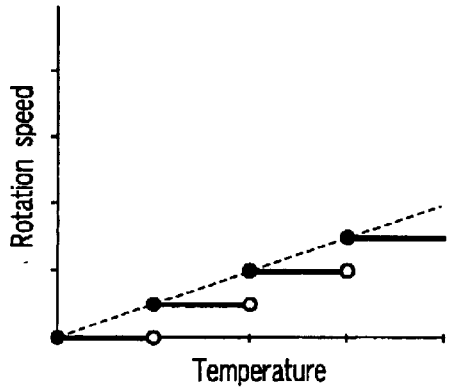

F I G. 10A

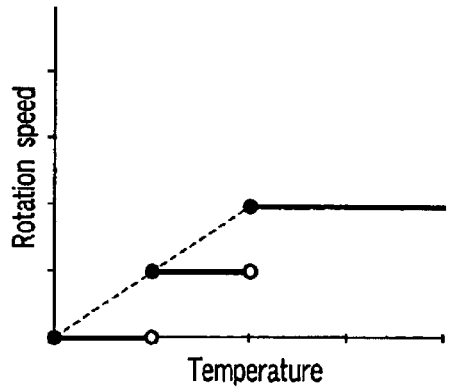

F I G. 10B

ELECTRONIC APPARATUS AND METHOD OF COOLING THE ELECTRONIC APPARATUS

CROSS-REFERENCE TO RELATED APPLICATIONS

This application is based upon and claims the benefit of priority from the prior Japanese Patent Application No. 2003-032448, filed Feb. 10, 2003, the entire contents of which are incorporated herein by reference.

BACKGROUND OF THE INVENTION

1. Field of the Invention

The present invention relates to a electronic apparatus and a method of cooling the electronic apparatus, which are particularly favorable for a notebook personal computer and the like.

2. Description of the Related Art

A notebook personal computer comprises a housing in which a cooling fan module is provided. The cooling fan module cools the entire system of the computer including a CPU. The compute also comprises a temperature sensing IC for sensing the temperature of the CPU. When the temperature of the CPU exceeds a preset temperature, the IC supplies a sensing signal to the cooling fan to rotate the cooling fan and thus cool the entire system of the computer including the CPU.

Jpn. Pat. Appln. KOKAI Publication No. 10-307648 discloses a method of controlling the rotation speed of a single fan module based on information obtained from temperature sensors located in different positions as well as a position corresponding to a CPU in a notebook personal computer.

In the computer of the Publication, the temperature sensors have their own temperature values in advance. When the temperature actually sensed by at least one temperature sensor is not lower than the preset temperature value, the fan module rotates to cool the entire system of the personal computer including the CPU.

Another system including a plurality of cooling fan modules to increase the volume of cooled air and the number of main cooling points is proposed. This system is similar to the control method of the above Publication in that the cooling fan modules turn on/off together.

As described above, conventionally, the entire system of a personal computer including a CPU is cooled by turning on/off cooling fan modules or controlling the rotation speed of the cooling fan modules.

Assume that a heating member such as a CPU that operates at high speed and generates a large amount of heat is loaded into a notebook personal computer whose cooling space is limited. It is very likely that the cooling fan modules will have to rotate at all times. This is not realistic in view of power consumption and noise.

BRIEF SUMMARY OF THE INVENTION

An object of the present invention is to provide a electronic apparatus that can efficiently cope with the thermal load of the system, and a method of cooling the electronic apparatus at a considerably small amount of power consumption even though a heating member such as a CPU having a large heating value is located in restricted space.

An electronic apparatus according to an aspect of the present invention, comprises a housing, a first heat-generating member provided in the housing, a heat-radiating member thermally connected to the first heat-generating member, a first fan module guiding air to the heat-radiating member, a second heat-generating member provided in the housing, a second fan module discharging air out of the housing, and a wall section provided in the housing, located between the first fan module and the second fan module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a block diagram of the arrangement of a cooling control circuit of a system of the personal computer according to the embodiment of the present invention.

FIG. 7 shows contents of fan control registers held by an embedded controller of the personal computer according to the embodiment of the present invention.

FIG. 8 shows contents of fan control tables set by the embedded controller of the personal computer according to the embodiment of the present invention.

FIG. 9 shows contents of a control table required by BIOS of the personal computer according to the embodiment of the present invention.

FIGS. 10A and 10B are graphs each showing a relationship between the temperature range of the control table shown in FIG. 9 and the rotation speed of each fun module.

DETAILED DESCRIPTION OF THE INVENTION

A notebook personal computer according to an embodiment of the present invention will now be described with reference to the accompanying drawings.

Figure 1:
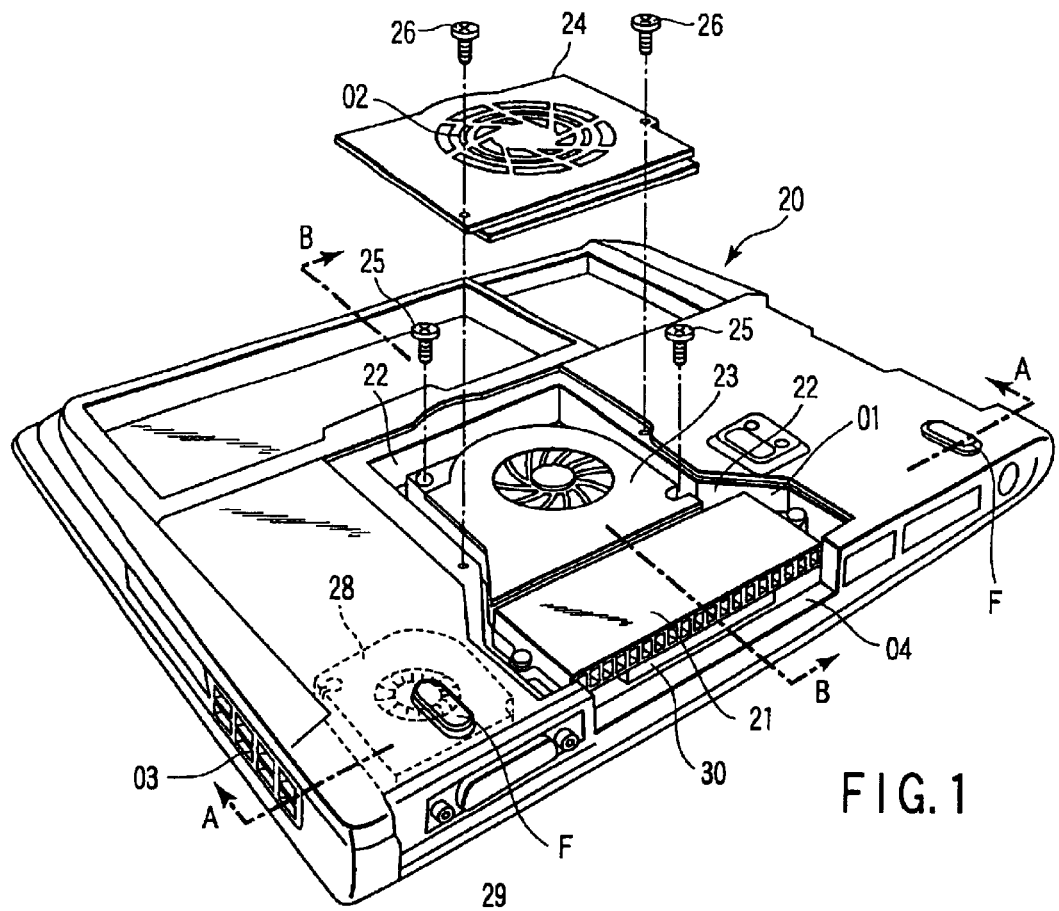
FIG. 1 is a perspective view illustrating a cooling fan module and a cooling passage on the bottom of a notebook personal computer according to an embodiment of the present invention.

FIG. 1 shows the bottom of a main body housing 20 of a personal computer (PC) when it is viewed from the back thereof. In FIG. 1, reference numeral 21 indicates a heat sink that is thermally connected to a CPU 30 located on the underside of the housing 20 to diffuse and cool the heat generated from the CPU 30. The heat sink 21 is provided in a CPU first cooling passage together with a CPU cooling fan module 23. The first cooling passage is spatially separated from, e.g., other circuit elements of the personal computer by a partition wall 22.

A fan panel 24 and a CPU panel (not shown) are mounted on the bottom of the main body housing 20 to cover a first opening O1. Actually, the first opening O1 includes the CPU 30, heat sink 21 and CPU cooling fan module 23.

The fan panel 24 has a slit serving as a second opening O2 through which cooled air is introduced by rotation of the CPU cooling fan module 23.

The cooling fan module 23 is secured to the cooling passage with screws 25 and the fan panel 24 and CPU panel are mounted with screws 26 or the like. When the cooling fan module 23 rotates under these conditions, outside air, which is taken from above the fan panel 24, is blown toward the heat sink 21. The air is then guided outside the main body housing 20 through a fourth opening O4 formed on the back of the housing 20.

When the above personal computer is actually used, a slight space is secured between the bottom of the personal computer and the mounting surface such as the top of a desk by legs F formed on the bottom of the main body housing 20 (FIG. 1 shows only two legs on the back of the housing but the housing requires at least four legs). This space allows air to be inhaled through the bottom of the housing 20.

The heat generated from the CPU 30 moves to the heat sink 21 and the flow of air discharged from the fan 23 cools the heat sink 21. The CPU 30 is cooled accordingly.

Reference numeral 28 (broken line) denotes a system cooling fan module. The system control fan module 28 cools circuit elements excluding the CPU 30 and heat sink 21 at once in the main body housing 20.

The system cooling fan module 28 is provided at the exit of a U-shaped second cooling passage that is formed to detour around the above CPU first cooling passage formed by the partition wall 22. The circuit elements other than the CPU 30 are arranged appropriately in the second cooling passage.

According to the present embodiment, the amount of air moved by one rotation of the CPU cooling fan module 23 is larger than that of air moved by one rotation of the system cooling fan module 28. The CPU cooling fan module 23 has a larger cooling capacity.

Therefore, even though the thermal load of the CPU 30 is equal to that of each of the circuit elements other than the CPU 30, the CPU cooling fan module 23 can cool the CPU 30 at a lower rotation speed.

Figure 2:
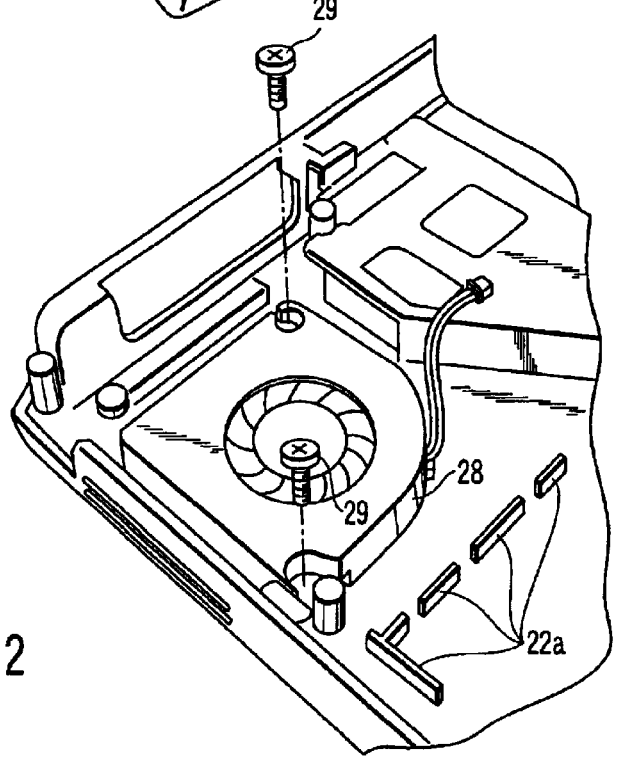
FIG. 2 is a perspective view showing a mounting state of a system cooling fan module of the personal computer according to the embodiment of the present invention.

FIG. 2 illustrates a mounting state of the system cooling fan module 28. The system cooling fan module 28 is mounted in a position of the main body housing 20, which corresponds to the second cooling passage, by screws 29.

In FIG. 2, reference numeral 22a denotes partition wall fitting sections that are formed integrally with the inner surface of the main body housing 20 and projected therefrom.

Since the partition wall fitting sections 22a are fitted to the partition wall 22, the first cooling passage for the CPU 30 and the second cooling passage for the circuit elements other than the CPU 30 are spatially separated from each other. Thus, the CPU 30 and the other circuit elements are cooled individually by the rotation of the CPU cooling fan module 23 and that of the system cooling fan module 28.

Figure 3:
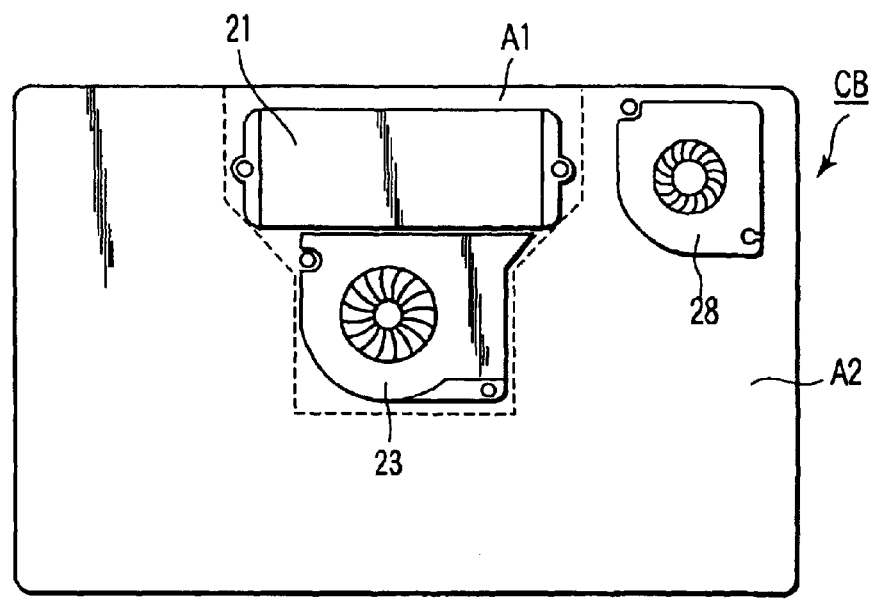
FIG. 3 shows a relationship between a substrate and first and second mounting areas of the personal computer according to the embodiment of the present invention.

FIG. 3 shows mounting areas in a circuit board CB formed in the main body housing 20 of the personal computer. The mounting surface of the circuit board CB is divided into first and second mounting areas A1 and A2 by the partition wall 22.

The first mounting area A1 includes the CPU 30, heat sink 21 thermally connected to the CPU 30, and CPU cooling fan module 23.

The second mounting area A2 includes the system cooling fan module 23 and the circuit elements other than the CPU 30.

In the first mounting area A1, the CPU cooling fan module 23 rotates to inhale air in the direction orthogonal to FIG. 3. The air discharged above from the CPU cooling fan module 23 is heat-exchanged with the heat sink 21 to cool the CPU 30. The heated air is discharged outside the main body housing 20 through the fourth opening O4 (not shown) from above the heat sink 21.

In the second mounting area A2, the air inhaled from the left side of FIG. 3 by the rotation of the system cooling fan module 28 flows in the form of the letter U so as to keep away from the first mounting area A1 on the circuit board CB. While the air is flowing, it is heat-exchanged with the circuit elements to cool them. The cooled air is discharged out of the main body housing 20 through the third opening O3 (not shown) on the right side of FIG. 3 by the system cooling fan module 28.

Figure 4:
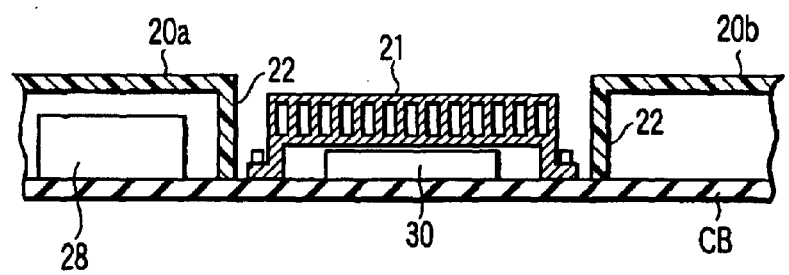
FIG. 4 is a sectional view showing a structure of a main body housing of the personal computer, taken along line A—A OF FIG. 1.

FIG. 4 shows a section of the main body housing 20 of the personal computer, taken along line A—A of FIG. 1. As in FIG. 1, the top of the section corresponds to the bottom of the main body housing 20.

Like FIG. 1, FIG. 4 shows the main body housing 20 from which the fan panel 24 is detached. The heat sink 21 is thermally connected to the CPU 30 mounted on the circuit board CB to cover the CPU 30. The heat sink 21 is fixed to the circuit board CB. As shown in FIG. 3, too, the first mounting area A1 including the CPU 30 and heat sink 21 and the second mounting area A2 including the system cooling fan 28 are spatially separated from each other by the partition wall 22.

Figure 5:
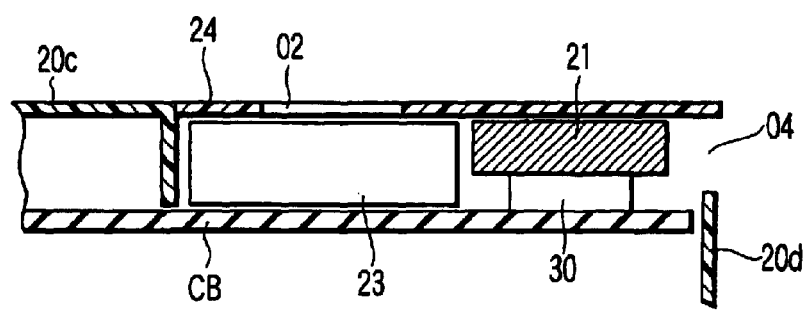
FIG. 5 is a sectional view showing a structure of a main body housing of the personal computer, taken along line B—B of FIG. 1.

FIG. 5 shows a section of the main body housing 20 of the personal computer, taken along line B—B of FIG. 1. As in FIG. 1, the top of the section corresponds to the bottom of the main body housing 20.

In the first mounting area A1, the air taken through the second opening O2 of the fan panel 24 from above FIG. 5 by the rotation of the CPU cooling fan module 23 is heat-exchanged by the heat sink 21. The heat sink 21 is projected from the right side of the CPU cooling fan module 23 and connected to the CPU 30. The heat-exchanged air is then discharged out of the housing 20 through the fourth opening O4. The air flows in the form of the letter L.

The flow path of the first mounting area A1 is longer and its air resistance is lower than that of the flow path of the second mounting area A2 having a number of bending portions.

Consequently, the CPU cooling fan module 23 can cool the CPU 30 more efficiently than the system cooling fan module 28 since its air volume is greater than that of the cooling fan module 28.

FIG. 6 shows a circuit arrangement for cooling the entire system including the CPU cooling fan module 23 and system cooling fan module 28. A temperature sensing IC 31 monitors the temperature of the CPU 30 thermally connected to the heat sink 21, which is one to be controlled.

The temperature sensing IC 31 is connected to a south bridge circuit 32 via a serial bus 33 and supplies a sensed-temperature signal THRM# of the CPU 30 to the south bridge circuit 32 and embedded controller 34.

When the temperature of the CPU 30 exceeds a preset temperature, the IC 31 senses it and sends a cooling-request signal FANREQ to the embedded controller 34.

The south bridge circuit 32 is connected to the CPU 30 to control the interface of the entire system. The south bridge circuit 32 is also connected to a BIOS 35 and embedded controller 34.

The BIOS 35 is a program executed between the south bridge circuit 32 and OS 36 to control various peripheral devices that make up the personal computer.

On the other hand, the system cooling fan module 28 and temperature sensing element 38 are provided at circuit elements 37 to be cooled excluding the CPU 30.

The temperature sensing element 38 is formed of, e.g., a thermistor. It is provided in that position of the circuit elements 37 which greatly decreases in performance and thus needs to be cooled because of a temperature rise. The element 38 sends a sensing signal corresponding to the sensed temperature to the embedded controller 34.

The embedded controller 34 holds a set value for individually controlling the rotation speeds of the CPU cooling fan module 23 and system cooling fan module 28 which are provided by the BIOS 35 through the south bridge circuit 32.

Upon receiving the sensed-temperature signal THRM# and cooling-request signal FANREQ from the temperature sensing IC 31, the embedded controller 34 causes a fan driving circuit 39 to apply a voltage to the CPU cooling fan module 23 to rotate the fan module 23 in accordance with the set value.

An operation of the personal computer according to the above-described embodiment will now be described.

FIG. 7 shows the contents of a fan control register R held by the embedded controller 34. The contents of the register R can be read/written by the BIOS 35 through the south bridge circuit 32.

The fan control register R includes a CPU fan control register R1 for the CPU cooling fan module 23 and a system fan control register R2 for the system cooling fan module 28.

The CPU fan control register R1 includes a zeroth register. The zeroth register holds rotation speed information of the CPU cooling fan module 23 required by the BIOS 35 or OS 36.

The system fan control register R2 includes zeroth to third registers.

The zeroth register of the register R2 holds rotation speed information of the system cooling fan module 28 required by the BIOS 35 or OS 36.

The first register of the register R2 holds temperature information for shifting an operation of the system cooling fan module 28 from off-state to on-state in response to a sensing signal from the temperature sensing element 38.

The second register of the register R2 holds temperature information for shifting an operation of the system cooling fan module 28 from on-state to off-state in response to a sensing signal from the temperature sensing element 38.

The third register of the register R2 holds rotation speed information of the system cooling fan module 28 required in response to a sensing signal from the temperature sensing element 38.

The zeroth register of the CPU fan control register R1 and the zeroth and third registers of the system fan control register R2 hold information of the rotation speeds required for the respective fans. To stop the rotation, they hold a value "0".

FIG. 8 shows contents of a fan control table T held by the embedded controller 34. The contents of the table T are set by the internal processing of the embedded controller 34.

The fan control table T includes a CPU fan control internal table Ti for the CPU cooling fan module 23 and a system fan control internal table T2 for the system cooling fan module 28.

The CPU fan control internal table T1 includes a zeroth table and a first table.

The rotation speed information of the CPU cooling fan module 23 transmitted from the BIOS 35 or OS 36 is set in the zeroth table of the table T1.

The rotation speed information obtained when the CPU cooling fan module 23 rotates in response to a cooling request signal FANREQ from the temperature sensing IC 31 is set in the first table of the table T1.

The system fan control internal table T2 includes zeroth to second tables.

The rotation speed information of the system cooling fan module 28 transmitted from the BIOS 35 or OS 36 is set in the zeroth table of the table T2.

The rotation speed information obtained when the system cooling fan module 28 rotates in response to a cooling request signal FANREQ from the temperature sensing IC 31 is set in the first table of the table T2.

The rotation speed information obtained when the system cooling fan module 28 rotates in response to a sensing signal from the temperature sensing element 38 is set in the second table of the table T2.

Information of the rotation speeds necessary for the respective fans is set in the zeroth and first tables of the CPU fan control internal table T1 and the zeroth to second tables of the system fan control internal table T2. To stop the rotation, a value "0" is set in the tables.

FIG. 9 is a control table TB for the CPU cooling fan module 23 and system cooling fan module 28 that are managed by the BIOS 35. The BIOS 35 reads the temperature of the CPU 30 sensed by the temperature sensing IC 31 from the south bridge circuit 32 via the serial bus and reads the rotation speed information of each of the fan modules 23 and 28 from the control table TB based on the sensed temperature. The read rotation speed information is supplied to the embedded controller 34 and held in the zeroth registers of the CPU fan control register R1 and system fan control register R2 of the fan control register R. The fan modules 23 and 28 are therefore required to rotate.

In the control table TB, different rotation speeds are preset to the CPU cooling fan module 23 and system cooling fan module 28 for respective temperature ranges. In the lowest-temperature range 1, for example, a value "0" is set to both the rotation speed A1 of the CPU cooling fan module 23 and the rotation speed B1 of the system cooling fan module 28. Consequently, the fan modules 23 and 28 can be prevented from uselessly rotating in a low-temperature range.

After that, different rotation speeds are preset to the CPU cooling fan module 23 and system cooling fan module 28 for each temperature range. The amount of air (cooling capacity) of the CPU cooling fan module 23 is larger than that of the system cooling fan module 28 as described above. Thus, the rotation speed An of the fan module 23 is set relatively lower than the rotation speed Bn of the fan module 28 even in the same temperature range n.

Assume that the rotation speed of the CPU cooling fan module 23 increases linearly as the temperature of the temperature range rises as shown in FIG. 10A.

Assume that the system cooling fan module 28 rotates at a preset maximum rotation speed even though the temperature of the temperature range rises and exceeds a certain value as shown in FIG. 10B.

Figure 11:
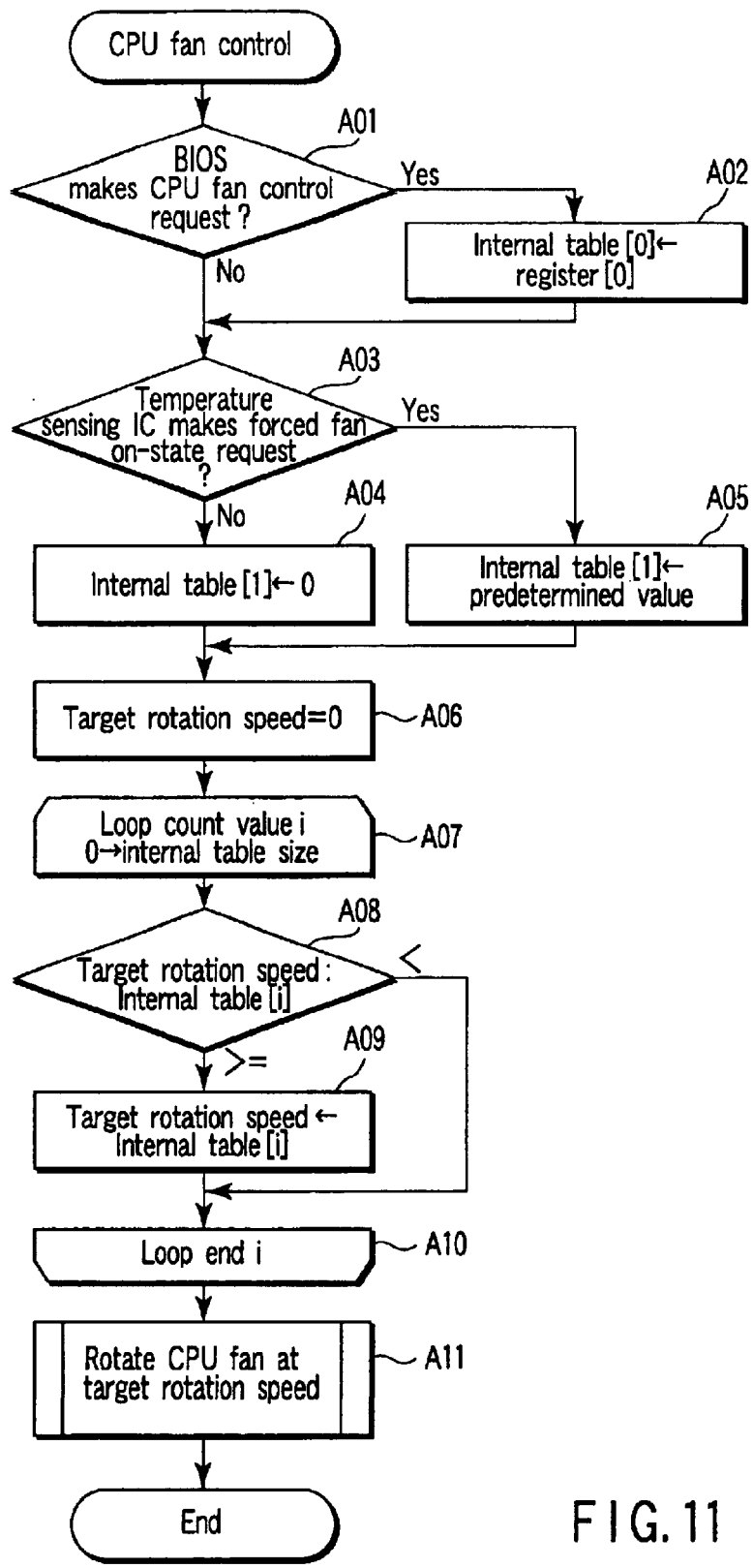
FIG. 11 is a flowchart of controlled contents of the CPU cooling fan module of the personal computer according to the embodiment of the present invention.

FIG. 11 shows a process of rotation control of the CPU cooling fan module 23 executed by the embedded controller 34 based on the contents that have been described with reference to FIGS. 7 to 10B.

First, the controller 34 determines whether a request to control the CPU cooling fan module 23 is issued from the BIOS 35 (step A01).

Only when the controller 34 determines that the request is issued, it holds the rotation speed information of the fan module 23 transmitted from the BIOS 35 in the zeroth register of the CPU fan control register R1 of the control register R, transfers the contents of the zeroth register to the zeroth table of the CPU fan control internal table T1 of the fan control table T, and sets them to the zeroth table (step A02).

After that, the controller 34 determines whether the temperature sensing IC 31 issues a cooling request signal FANREQ (step A03).

When the signal FANREQ is not issued, the controller 34 sets the rotation speed "0" indicating that the fan module 23 does not rotate in the first table of the CPU fan control internal table T1 (step A04). When the signal FANREQ is issued, the controller 34 sets a preset value, and more specifically, the maximum rotation speed of the fan module 23 in the first table of the table T1 (step A05).

After that, the value "0" indicating that the CPU cooling fan module 23 does not rotate is temporarily set as a target rotation speed for driving the fan module 23 (step A06).

A loop process is performed based on the total number of tables of the CPU control internal table T1 of the fan control table T (steps A07 to A10).

In the loop process, when the target rotation speed of the CPU cooling fan module 23 is not higher than the set value of the i-th table indicated by the loop count value i, a process of resetting the set value as a target rotation speed is repeated while updating the loop count value i by "+1" in sequence from "1" until the value i reaches the maximum (=2).

In the loop process, the target rotation speed is updated by selecting the largest one from the rotation speeds of the CPU cooling fan module 23 in each of the tables of the CPU fan control internal table T1.

After the loop process, the CPU cooling fan module 23 rotates at the target rotation speed (step A11). The control process of the CPU cooling fan module 23 ends.

Figure 12:
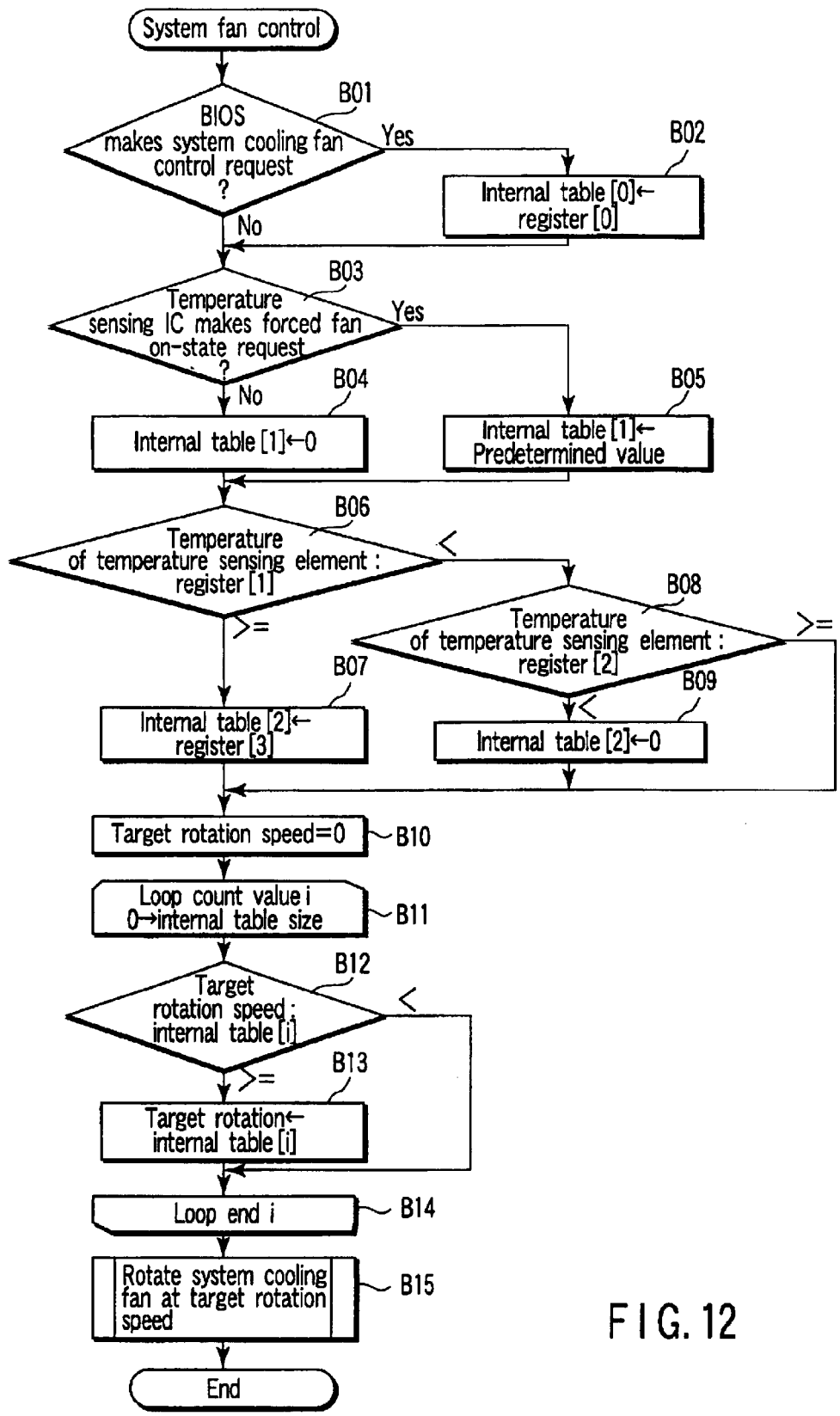
FIG. 12 is a flowchart of controlled contents of the system cooling fan module according to the embodiment of the present invention.

FIG. 12 shows a process of rotation control of the system cooling fan module 28 executed by the embedded controller 34.

First, the controller 34 determines whether a request to control the system cooling fan module 28 is issued from the BIOS 35 (step B01).

Only when the controller 34 determines that the request is issued, it holds the rotation speed information of the fan module 28 transmitted from the BIOS 35 in the zeroth register of the system fan control register R2 of the control register R, transfers the contents of the zeroth register to the zeroth table of the system fan control internal table T2 of the fan control table T, and sets them to the zeroth table (step B02).

After that, the controller 34 determines whether the temperature sensing IC 31 issues a cooling request signal FANREQ (step B03).

When the signal FANREQ is not issued, the controller 34 sets the rotation speed "0" indicating that the fan module 28 does not rotate in the first table of the system fan control internal table T2 (step B04).

When the signal FANREQ is issued, the controller 34 sets a preset value and, more specifically, the maximum rotation speed of the fan module 28 in the first table of the table T2 (step B05).

The controller 34 then determines whether the temperature of the cooling passage sensed by the temperature sensing element 38 is not lower than the temperature held in the first register of the system fan control register R2 (step B06).

When the controller 34 determines that the temperature of the cooling passage is not lower than the temperature held in the first register, it sets the rotation speed information of the fan module 28, which is held in the third register of the register R2, in the second table of the table T2 (step B07).

When the controller 34 determines in step B06 that the temperature sensed by the element 38 is lower than the temperature held in the first register of the register R2, it determines whether the sensed temperature is lower than temperature held in the second register of the register R2 (step B08).

Only when the controller 34 determines that the temperature sensed by the element 38 is lower than the temperature held in the second register of the register R2, it sets the rotation speed "0" indicating that the fan module 28 does not rotate in the second table of the system fan control internal table T2 (step B09).

After that, the value "0" indicating that the system cooling fan module 28 does not rotate is temporarily set as a target rotation speed for driving the fan module 28 (step B10).

A loop process is performed based on the total number of tables of the system fan control internal table T2 of the fan control table T (steps B11 to B14).

In the loop process, when the target rotation speed of the system cooling fan module 28 is not higher than the set value of the i-th table indicated by the loop count value i, a process of resetting the set value as a target rotation speed is repeated while updating the loop count value i by "+1" in sequence from "1" until the value i reaches the maximum (=3).

In the loop process, the target rotation speed is updated by selecting the largest one from the rotation speeds of the system cooling fan module 28 in each of the tables of the system fan control internal table T2.

After the loop process, the system cooling fan module 28 rotates at the target rotation speed (step B15). The control process of the system cooling fan module 28 ends.

As described above, the CPU 30 and the other circuit elements configuring the system are spatially separated into two cooling passages. The elements in the respective cooling passages are individually cooled using the CPU cooling fan module 23 and system cooling fan module 28. Consequently, though the CPU 30 having a large heating value is loaded into a notebook personal computer, it can be cooled with efficiency even at such a relatively low rotation speed as not to cause any noise problem if the CPU cooling fan module 23 has a high volume of air to cope with the thermal load of the computer.

The circuit elements other than the CPU 30 are arranged in the cooling passage spatially separated from that of the CPU 30. Basically, the circuit elements are cooled by the rotation of the system cooling fan module 28 independently of the heat generation of the CPU 30.

The system of the CPU 30 and that of the circuit elements other than the CPU 30 are cooled separately from each other. The cooling operation has only to be performed to a required extent in a required system. Wasted power consumption can thus be avoided.

When the step A03 in FIG. 11 determines that the cooling-request signal FANREQ is input to the embedded controller 34 from the temperature sensing IC 31, a value preset in the first table of the CPU fan control internal table T1 and, more specifically, the maximum rotation speed of the CPU cooling fan module 23 is set in the subsequent step A05. When the step B03 in FIG. 12 make the same determination, a value preset in the first table of the table T2 and, more specifically, the maximum rotation speed of the system cooling fan module 28 is set in the subsequent step B05.

When the heating value of the CPU 30 that is the operation center of the personal computer is extraordinarily high, not only the CPU cooling fan module 23 for the CPU 30 but also the system cooling fan module 28 for the system other than the CPU 30 rotates at the maximum rotation speed and these fans cool the two cooling passages at the largest cooling capacity.

Consequently, the cooling of the cooling passage on the system other than the CPU 30 can contribute to that of the CPU 30.

As has been described with reference to FIGS. 7 to 9, 11 and 12, the BIOS 35 sets the rotation speed of each of the CPU and system cooling fan modules 23 and 28 and a comparative value between the temperatures sensed by the temperature sensing IC 31 and temperature sensing element 38 in the embedded controller 34. Based on the contents set in the BIOS 35, the controller 34 controls the rotation of the fan modules 23 and 28.

The personal computer has its own temperature characteristics such as air-flowing efficiency of each of two cooling passages spatially separated by the partition wall 22, an amount of air cooled by the fan modules 23 and 28, and an amount of heat generated from the CPU 30 and the other circuit elements. If the BIOS 35 sets proper contents in the main body housing 20 of the personal computer according to the temperature characteristics, the CPU 30 and the other circuit elements can reliably be cooled with high efficiency without wasting power.

As shown in FIG. 9 and FIGS. 10A and 10B in particular, the BIOS 35 sets the rotation speed of each of the CPU and system cooling fan modules 23 and 28 to a higher value in accordance with a rise in the temperature of ranges including the temperatures sensed by the temperature sensing IC 31 and temperature sensing element 38 rise.

Power consumption can thus be minimized without any wasted driving of the fan modules 23 and 28 at a high rotation speed. The user of the personal computer can be provided with a comfortable environment for use.

In the foregoing embodiment, two spaces corresponding to the first and second mounting areas A1 and A2 on the circuit board CB are separated from each other by the partition wall 22. However, the following modification can be made, depending on the relationship in arrangement between the CPU 30 and heat sink 21 on the mounting area A1 and some of the circuit elements on the mounting area A2 that have a large heating value. The two spaces can be connected to each other by forming a notch in the partition wall 22 to inhale air corresponding to the second mounting area A2 and discharge it from the fourth opening 04 by rotating the CPU cooling fan module 23 or inhale air corresponding to the first mounting area A1 and discharge it from the third opening 03 by rotating the system cooling fan module 28.

The notch formed in an appropriate position of the partition wall 22 allows the two spaces to be connected to each other to mutually assist in the cooling operations of the fan modules 23 and 28. When only one of the fans is used to cool an element on one side, it can cool another element on the other side to some extent. Consequently, the personal computer can be operated efficiently by reducing power consumption.

The forgoing embodiment is directed to a notebook personal computer. The present invention is not limited to the notebook personal computer but can be applied to an information processing apparatus, such as a board type personal computer and a PDA (personal digital assistant), if the apparatus has a processing performance and cools the heat generated from a circuit element with efficiency though the size of the housing is restricted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
   a housing;
   a first heat-generating member provided in the housing;
   a heat-radiating member thermally connected to the first heat-generating member;
   a first fan module guiding air to the heat-radiating member;
   a second heat-generating member provided in the housing;
   a second fan module discharging air out of the housing; and
   a wall section provided in the housing, located between the first fan module and the second fan module.

2. The electronic apparatus according to claim 1, wherein the heat-radiating member is provided at an end of the housing, the first fan module is provided in the housing more inwardly than the heat-radiating member, and the first fan module guides air outside the housing by blowing air to the heat-radiating member.

3. The electronic apparatus according to claim 2, wherein the second fan module is provided at the end of the housing, and the second heat-generating member is provided in the housing more inwardly than the second fan module.

4. An electronic apparatus comprising:
   a circuit board including a first mounting area on which a heat-generating component is mounted and a second mounting area different from the first mounting area;
   a housing including the circuit board and having a first opening opposed to the first mounting area;
   a heat-radiating member mounted on the first mounting area and thermally connected to the heat-generating component;
   a first fan module mounted on the first mounting area to guide air to the heat-radiating member;

a partition wall which extends in a direction of the circuit board from the first opening, the partition wall being formed integrally with the circuit board as one component; and a cover attached to the first opening to cover the first mounting area and having a second opening opposed to the first fan module.

5. The electronic apparatus according to claim 4, further comprising:

a third opening formed in the housing in correspondence with the second mounting area; and a second fan mounted on the second mounting area to discharge air from the housing through the third opening.

6. The electronic apparatus according to claim 5, wherein the partition wall is located between the first fan module and the second fan module.

7. The electronic apparatus according to claim 4, wherein the housing has a fourth opening opposed to the heat-radiating member, and the first fan module inhales air from the housing through the second opening, blows the inhaled air on the heat-radiating member and discharges the air outside the housing through the fourth opening.

8. The electronic apparatus according to claim 7, wherein the first fan module has an air inhaling port opposed to the second opening and an air discharging port opposed to the heat-radiating member.

9. The electronic apparatus according to claim 7, wherein the partition wall surrounds the first mounting area except for a portion corresponding to the fourth opening.

10. The electronic apparatus according to claim 4, wherein the partition wall contacts the circuit board.

11. The electronic apparatus according to claim 5, wherein the partition wall has a notch and the first fan module discharges air outside the first and second mounting areas from the third opening through the notch.

12. The electronic apparatus according to claim 5, wherein the partition wall has a notch and the second fan module discharges air outside the first and second mounting areas through the notch.

* * * * *